United States Patent

Tsukahara

[19]

[11] Patent Number: 6,051,093
[45] Date of Patent: Apr. 18, 2000

[54] MOUNTING METHOD OF SEMICONDUCTOR ELEMENT

[75] Inventor: Norihito Tsukahara, Kyoto, Japan

[73] Assignee: Matsushita Electric Industrial Co., Ltd., Osaka, Japan

[21] Appl. No.: 09/011,603

[22] PCT Filed: Jun. 6, 1997

[86] PCT No.: PCT/JP97/01971

§ 371 Date: Feb. 6, 1998

§ 102(e) Date: Feb. 6, 1998

[87] PCT Pub. No.: WO97/47031

PCT Pub. Date: Dec. 11, 1997

[30] Foreign Application Priority Data

Jun. 7, 1996 [JP] Japan ................................. 8-145241

[51] Int. Cl.[7] ............................. B32B 31/00; H01L 21/00
[52] U.S. Cl. ..................... 156/251; 156/261; 156/298; 156/305; 156/306.6; 156/306.9; 228/180.22; 29/852; 427/97
[58] Field of Search .................................. 156/267, 305, 156/261, 306.6, 251, 263, 273.5, 306.9, 298; 29/852; 427/97; 228/180.22

[56] References Cited

U.S. PATENT DOCUMENTS

| | | | |
|---|---|---|---|
| 5,014,111 | 5/1991 | Tsuda et al. | 257/737 |
| 5,274,916 | 1/1994 | Kawabata et al. | 29/848 |
| 5,384,952 | 1/1995 | Matsui | 29/840 |
| 5,407,864 | 4/1995 | Kim | 29/834 |
| 5,615,477 | 4/1997 | Sweitzer | 29/840 |
| 5,843,251 | 1/1998 | Tsukagoshi et al. | 156/64 |
| 5,848,466 | 12/1998 | Viza et al. | 29/840 |

FOREIGN PATENT DOCUMENTS

| | | |
|---|---|---|
| 0 482 940 | 4/1992 | European Pat. Off. . |
| 0 735 579 | 10/1996 | European Pat. Off. . |
| 60-126856 | 7/1985 | Japan . |
| 01198040 | 8/1989 | Japan . |
| 4-267394 | 5/1992 | Japan . |
| 5-267394 | 10/1993 | Japan . |
| 06069278 | 3/1994 | Japan . |

OTHER PUBLICATIONS

European Search Report for Int'l Appln No. 97925302.8 dated Feb. 26, 1999.

Japanese language search report for Int'l Appln. No. PCT/JP97/01971 dated Dec. 8, 1997.

English translation of Form PCT/IS/210.

*Primary Examiner*—Curtis Mayes
*Assistant Examiner*—Linda L. Gray
*Attorney, Agent, or Firm*—Ratner & Prestia

[57] ABSTRACT

A mounting method of a semiconductor element capable of joining an electrode of a semiconductor element and a circuit board at high reliability. The method includes a step of forming an external electrode terminal by filling a hole formed in circuit board with a conductive paste, a step of positioning the external electrode terminal and a protruding bump formed on an electrode of a semiconductor, and a step of pressing the semiconductor element to contact between the conductive paste in the hole and the protruding bump thereby electrically connecting the electrode of the semiconductor element and the external electrode terminal of the circuit board. An adhesive sheet of a thermosetting resin, a thermoplastic resin, or a mixed thermosetting and thermoplastic resin may be disposed on the circuit board where the bump breaks through the sheet to contact the paste.

1 Claim, 14 Drawing Sheets

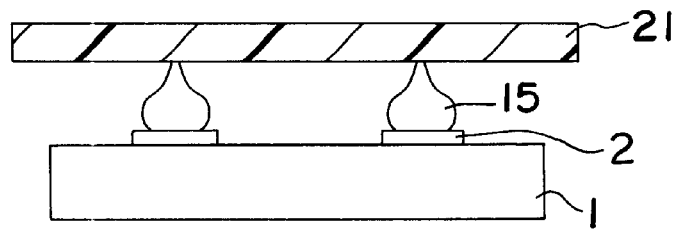
F I G. 15(a)
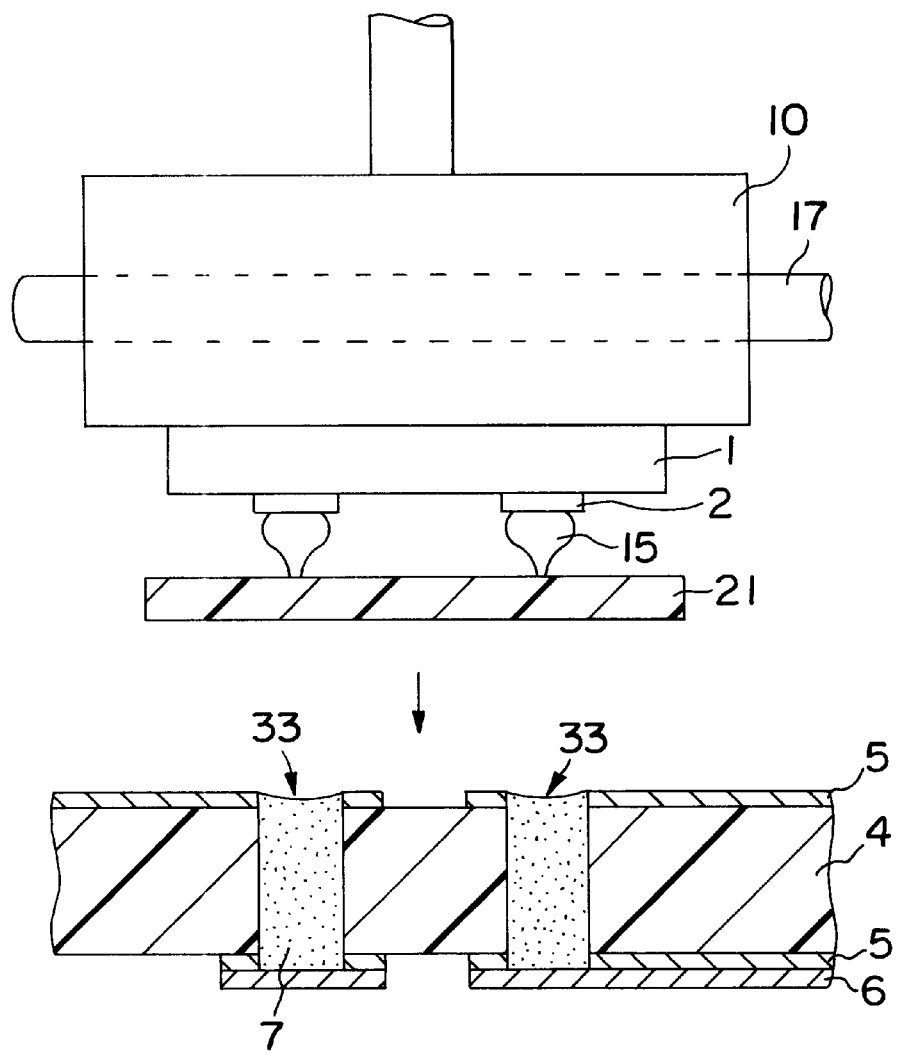
F I G. 15(b)

MOUNTING METHOD OF SEMICONDUCTOR ELEMENT

This Application is a U.S. National Phase Application of PCT International Application PCT/JP97/01971.

TECHNICAL FIELD

The present invention relates to a mounting method of semiconductor element for mounting a flip chip type semiconductor element on a circuit board of semiconductor element at high reliability and high density.

BACKGROUND ART

Conventional mounting methods of semiconductor element are described below by referring to the drawings.

(Prior Art 1)

FIG. 16 is a sectional view of mounting a semiconductor element on a circuit board in prior art 1.

In FIG. 16, reference numeral 1 is a semiconductor element, an electrode 2 is formed on the semiconductor element 1, and a protruding bump (metal ball bump) 15 made of gold, copper, aluminum, solder or the like is formed on the electrode 2 by wire bonding method.

Reference numeral 4 is a circuit board made of an insulating substrate, and a copper foil 5 to be used as wiring is formed on this circuit board 4, and a copper-plated external electrode terminal 6 is formed on the circuit board 4. To conduct within the circuit board, a hole 8 formed in the circuit board 4 is filled with conductive paste 7.

Reference numeral 22 is a conductive paste (conductive adhesive) having conductive powder of silver, gold, nickel, carbon or the like dispersed uniformly on phenol or epoxy resin. The external electrode terminal 6 of the circuit board 4 and the electrode 2 of the semiconductor element 1 are electrically connected with each other through the protruding bump 15. The space between the circuit board 4 and semiconductor element 1 is filled with epoxy resin 20.

A mounting method of thus constituted semiconductor device is described below.

The conductive paste 22 is transferred on the protruding bump 15 formed on each electrode 2 of the semiconductor element 1 by transfer method, it is mounted so that the protruding bump 15 may coincide with the external electrode terminal 6 of the circuit board 4 to be mounted, and then it is heated to cure the conductive paste 22. In this way, the electrode 2 of the semiconductor element 1 and the external electrode terminal 6 of the circuit board 4 are electrically connected. After the connection, the space between the semiconductor element 1 and circuit board 4 is filled with the epoxy resin 20, and by making use of the shrinking force of its curing, continuous contact of the conductive powder of the conductive paste 22 is obtained, so that electrical and mechanical reliability is assured.

(Prior Art 2)

FIG. 17 is a sectional view of mounting a semiconductor element on a circuit board in prior art 2. Same parts as in the constitution in FIG. 16 are identified with same reference numerals and their explanation is omitted.

In FIG. 17, reference numeral 23 is a metal bump formed on an electrode 2 by electric plating method, and the metal bump 23 is, for example, plated with copper and further plated with gold 24. Reference numeral 25 is an external electrode terminal, and 16 is a passivation film for protecting the active surface of the semiconductor element 1.

A mounting method of thus constituted semiconductor device is described below.

The conductive paste 22 is transferred on the metal bump 23 formed on each electrode 2 of the semiconductor element 1 by transfer method, it is mounted so that the metal bump 23 may coincide with the external electrode terminal 25 of the circuit board 4 to be mounted, and then it is heated to cure the conductive paste 22. In this way, the electrode 2 of the semiconductor element 1 and the external electrode terminal 25 of the circuit board 4 are electrically connected. After the connection, the space between the semiconductor element 1 and circuit board 4 is filled with the epoxy resin 20, and by making use of the shrinking force of its curing, continuous contact of the conductive powder of the conductive paste 22 is obtained, so that electrical and mechanical reliability is assured.

(Prior Art 3)

FIG. 18 is a sectional view of mounting a semiconductor element on a circuit board in prior art 3. Same parts as in the constitution in FIG. 16 and FIG. 17 are identified with same reference numerals and their explanation is omitted.

In FIG. 18, reference numeral 3 is a protruding bump (protruding electrode) formed on an electrode 2 by plating method, and 26 is an insulating adhesive film, and conductive particles 27 of nickel, solder, carbon, or the like are uniformly dispersed in the insulating adhesive film 26.

A mounting method of thus constituted semiconductor device is described below.

The insulating adhesive film 26 is positioned between the semiconductor element 1 and external electrode terminal 25 of the circuit board 4, and heated and pressurized simultaneously. As a result, the adhesive film 26 is melted to flow into the space in the electrode 25, the conductive particles 27 are fixed and held by the protruding pump 3 and external electrode terminal 25, so that the protruding bump 3 and external electrode terminal 25 conduct. In the space, on the other hand, the conductive particles 27 remain dispersed in the adhesive, and the insulation is maintained. The adhesive film 26 is cured when cooled, and the semiconductor element 1 and circuit board 4 are fixed, and the connection reliability is assured. the mounting method of semiconductor element in prior art 1 (or prior art 2), however, as shown in FIG. 19, when transferring the conductive paste film 28 on the protruding bump 15 by transfer method and joining the bump 15 to the external electrode 6 of the circuit board 4, it is hard to control the amount of the conductive paste 22 to be transferred, and if the amount of the paste 22 is slightly excessive, a short circuit 30 may be formed in the electrode 2 by the conductive paste 22. Or if the circuit board 4 is slightly warped, the electrode 2 of the semiconductor element 1 and the external electrode terminal 6 of the circuit board 4 do not contact with each other through the conductive paste 22, and it is electrically open between the electrode 2 and external electrode terminal 6.

Further, as shown in FIG. 20, when filling the space between the semiconductor element 1 and circuit board 4 with epoxy resin 20, the epoxy resin 20 contained in a syringe 31 is injected from the periphery of the semiconductor element 1, and it takes more than 10 minutes to inject, and it was a bottleneck for shortening the cycle time of production line of semiconductor element 1.

In the mounting method of semiconductor element in prior art 3, since conduction is achieved by fixing and holding the conductive particles 27 between the electrode 2 of the semiconductor element 1 and electrode 25 of the circuit board 4, if the circuit board 4 is slightly warped or curved A as shown in FIG. 21, the conductive particles 27 remain dispersed in the adhesive 26, and the protruding bump 3 of the semiconductor element 1 and the electrode 25 of the circuit board 4 do not contact with each other, and hence it is electrically open between the protruding bump 3 and electrode 25. In the mounting method of prior art 3, incidentally, it is applied to a glass substrate which is hardly warped or curved, and is not applied to resin substrate.

It is hence an object of the invention to present a mounting method of semiconductor element free from occurrence of defects such as short circuit or open state between electrodes, capable of mounting at high electric reliability, curtailing the time substantially in the sealing process, and shortening the cycle time of semiconductor production line.

DISCLOSURE OF THE INVENTION

To achieve the above object, the mounting method of semiconductor element of the invention comprises a step of forming a hole in a position of a circuit board for connecting a circuit of the circuit board and an electrode of a semiconductor element, a step of filling the hole with a conductive paste for forming an external electrode terminal, a step of forming a protruding bump on the electrode of the semiconductor element, a step of positioning the external electrode terminal and the protruding bump formed on the electrode of the semiconductor element, and a step of pressing the semiconductor element to contact between the conductive paste in the hole and the protruding bump, thereby electrically connecting the electrode of the semiconductor element and the external electrode terminal of the circuit board.

In this mounting method of semiconductor element, the conductive paste charged in the hole of the circuit board and the protruding bump formed on the electrode of the semiconductor element are sought to contact with each other, and the electrode of the semiconductor element and the external electrode terminal of the circuit board are electrically connected, so that mounting of high electrical reliability is achieved without causing defects such as short circuit or open state between the electrodes.

BRIEF DESCRIPTION OF THE DRAWINGS

FIG. 15(a)–15(b) is a diagram showing mounting steps sequentially in embodiment 8 of the invention.

BEST MODE FOR CARRYING OUT THE INVENTION

Figure 1:
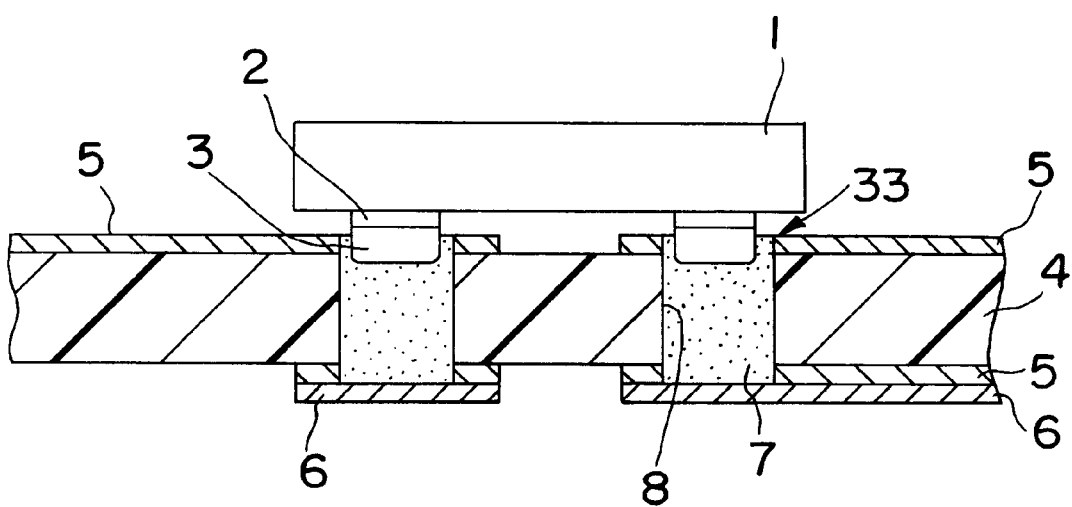
FIG. 1 is a junction sectional view of a semiconductor element and a circuit board after mounting in embodiment 1 of the invention.

The invention as set forth in the claims is a mounting method of semiconductor element comprising a step of forming a hole in a position of a circuit board for connecting a circuit of the circuit board and an electrode of a semiconductor element, a step of filling the hole with a conductive paste for forming an external electrode terminal, a step of forming a protruding bump on the electrode of the semiconductor element, a step of positioning the external electrode terminal and the protruding bump formed on the electrode of the semiconductor element, and a step of pressing the semiconductor element to contact between the conductive paste in the hole and the protruding bump, thereby electrically connecting the electrode of the semiconductor element and the external electrode terminal of the circuit board. According to this method, the protruding bump contacts with the conductive paste in the hole of the circuit board, and is electrically connected, and hence open state or short circuit does not occur.

The invention as set forth in the claims relates to a mounting method of semiconductor element of the claims, in which the protruding bump formed on the electrode of the semiconductor element is a metal ball bump formed by wire bonding method. When the protruding bump is formed by electric plating method, the height of the formed bump is about 25 microns at maximum, whereas the wire bonding method can form the bump as high as 50 microns or more, so that the amount of the bump filled with the conductive paste in the hole in the circuit board increases, and mounting of higher reliability is realized.

The invention as set forth in the claims relates to a mounting method of semiconductor element of the claims, which further comprises a step of, after pressing the semiconductor element to contact between the conductive paste charged in the hole of the circuit board and the protruding bump on the electrode of the semiconductor element, heating at least one of the semiconductor element and the circuit board by a heating tool, thereby curing the conductive paste. By curing the conductive paste, fixing of the semiconductor element and circuit board is stronger, and the junction is higher in reliability. Moreover, as compared with the conventional curing of the conductive paste in batch process by putting the module in an oven, it can be done simultaneously with joining in the same equipment in the method of the invention, so that the cycle time of production line of semiconductor element can be shortened.

The invention as set forth in the claims relates to a mounting method of semiconductor element of any one of the claims, which further comprises a step of, after connecting the electrode of the semiconductor element and the external electrode terminal of the circuit board, pouring an epoxy resin into the space between the semiconductor element and the circuit board, and sealing. Since the active surface of the semiconductor element and the electrode surface are protected by the epoxy resin, the reliability of connection is further increased.

The invention as set forth in the claims is a mounting method of semiconductor element comprising a step of forming a hole in a position of a circuit board for connecting a circuit of the circuit board and an electrode of a semiconductor element, a step of filling the hole with a conductive paste for forming an external electrode terminal, a step of forming a protruding bump on the electrode of the semiconductor element, a step of disposing an adhesive sheet having a thermosetting resin, a thermoplastic resin, or a mixed thermosetting and thermoplastic resin, on the circuit board forming the external electrode terminal or the protruding bump of the semiconductor element, a step of positioning the external electrode terminal and the protruding bump formed on the electrode of the semiconductor element, a step of pressing the semiconductor element to break through the adhesive sheet by the protruding bump so as to contact between the conductive paste in the hole and the protruding bump, thereby electrically connecting the electrode of the semiconductor element and the external electrode terminal of the circuit board, and a step of heating the semiconductor element by a heating tool to melt and cure the adhesive sheet. According to the method, since the adhesive sheet protects the active surface of the semiconductor element and the electrode surface after melting and curing, the reliability of connection is increased. Further, in the case of using the adhesive sheet, the time required for pressurizing and curing is about 30 seconds, whereas the curing time is about 4 hours in the conventional method by using the epoxy resin, and therefore since the curing time in this method is very short, the cycle time of production line of semiconductor element is shortened.

Figure 16:
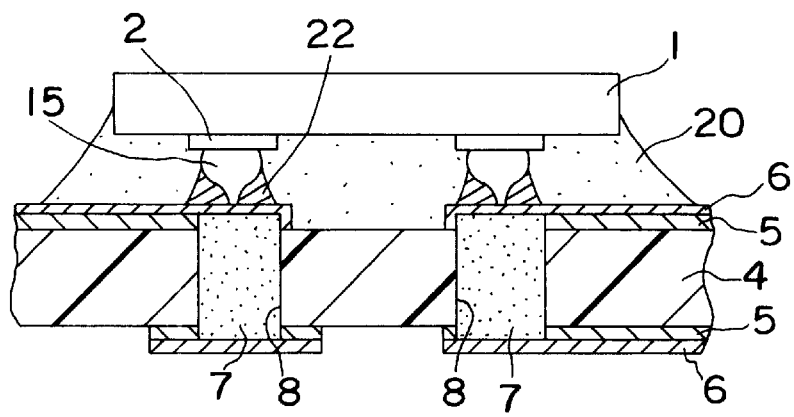
FIG. 16 is a junction sectional view of a semiconductor element and a circuit board after mounting in a conventional mounting method of semiconductor element.
Figure 17:
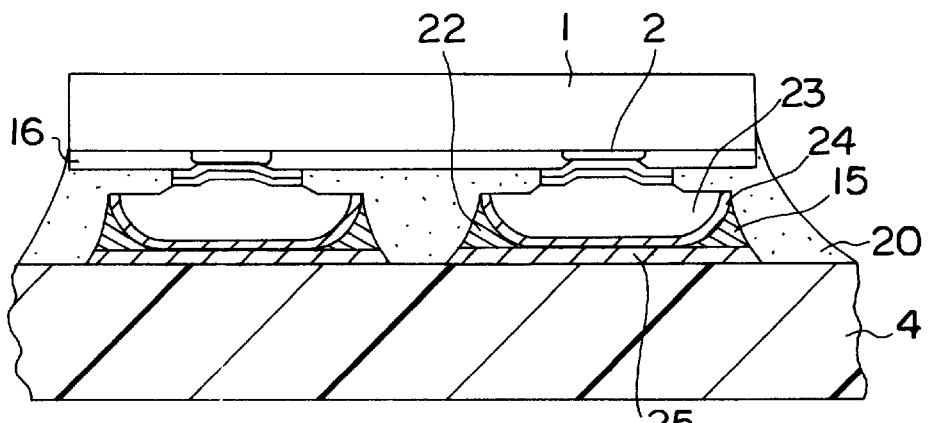
FIG. 17 is a junction sectional view of a semiconductor element and a circuit board after mounting in a conventional mounting method of semiconductor element.
Figure 18:
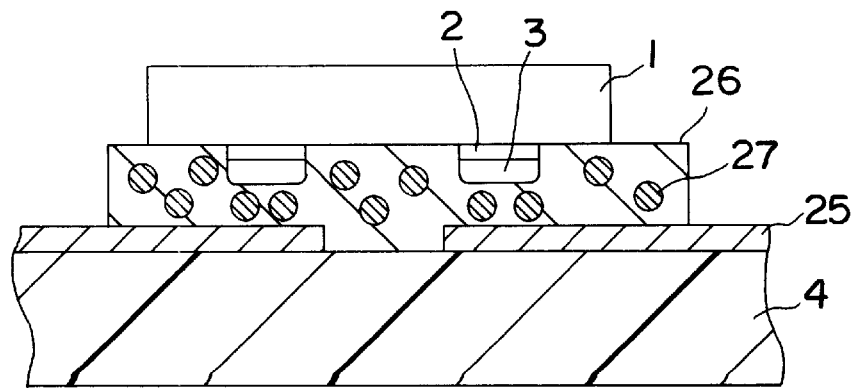
FIG. 18 is a junction sectional view of a semiconductor element and a circuit board after mounting in a conventional mounting method of semiconductor element.
Figure 19A:
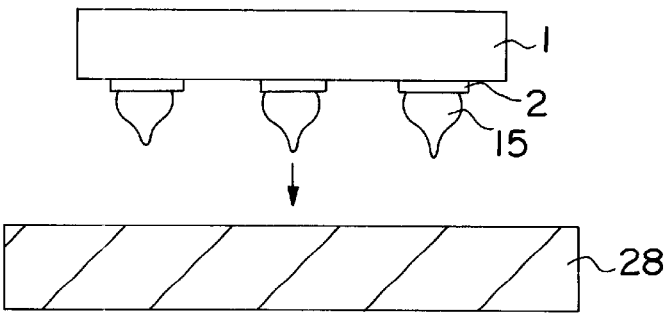
FIG. 19(a)–19(d) is a diagram showing conventional mounting steps sequentially.
Figure 19B:
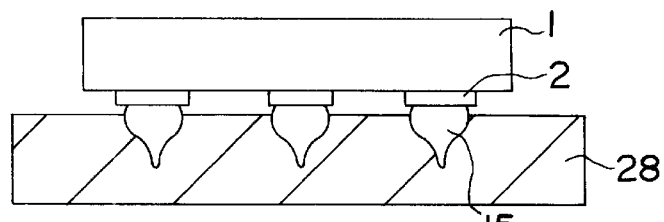
Figure 19C:
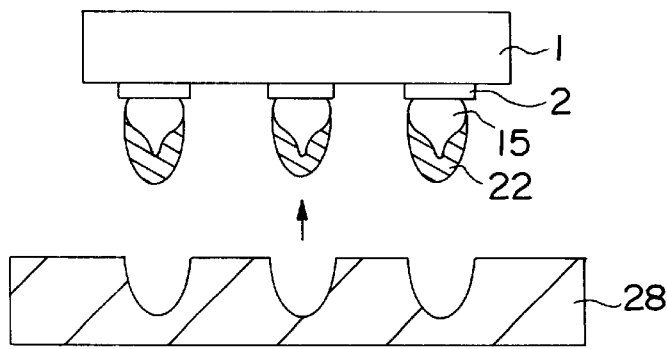
Figure 19D:
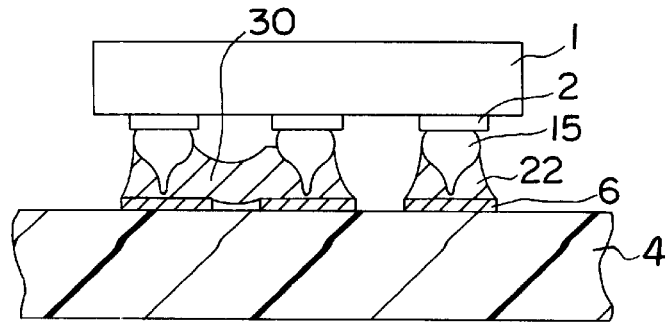
Figure 20:
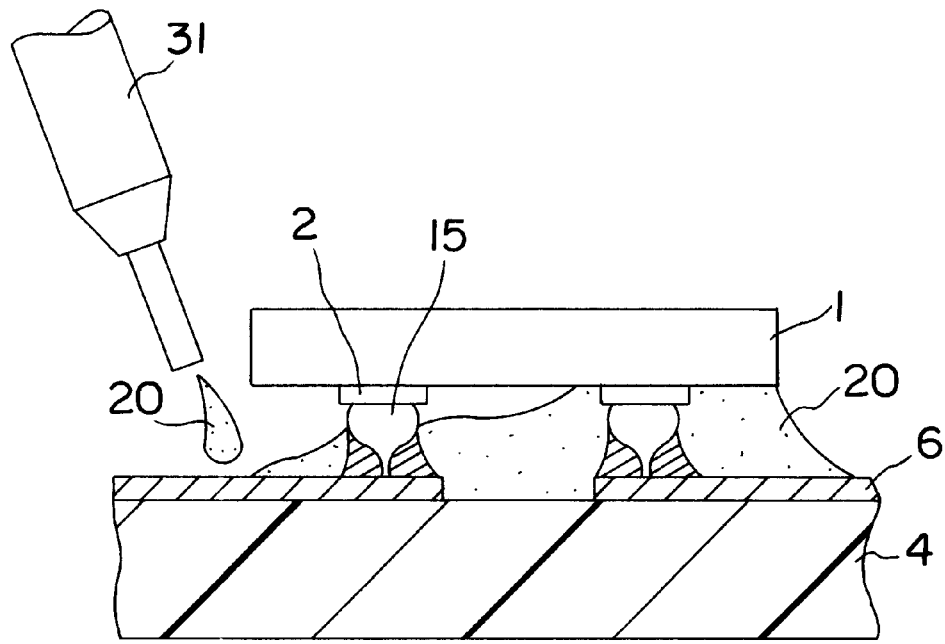
FIG. 20 is a diagram for explaining a problem of a conventional mounting method.
Figure 21:
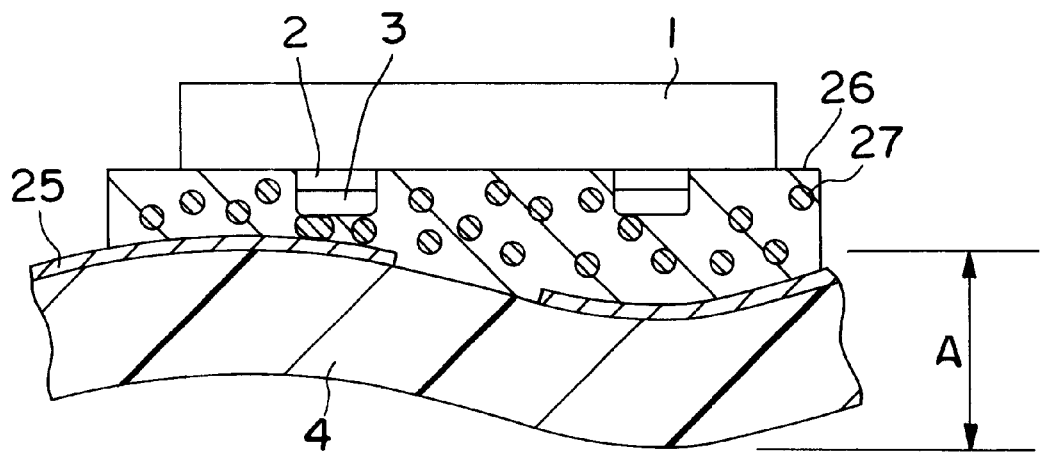
FIG. 21 is a diagram for explaining a problem of a conventional mounting method.

Referring now to the drawings, embodiments of the invention are described below. Same parts as in the constitution in FIG. 16 to FIG. 18 showing prior arts are identified with same reference numerals, and their explanation is omitted.

(Embodiment 1)

FIG. 1 is a sectional view of a circuit board mounting a semiconductor element in embodiment 1 of the invention.

As shown in the diagram, a protruding bump 3 formed on an electrode 2 of a semiconductor element 1 contacts, as being buried in, with a conductive paste 7 filling up a hole 8 of a circuit board 4, so that an external electrode terminal 6 of the circuit board 4 and the electrode 2 of the semiconductor element 1 are electrically connected. Referring to a process diagram in FIG. 2, a mounting method of semiconductor element of the invention is described below.

Figure 2A:
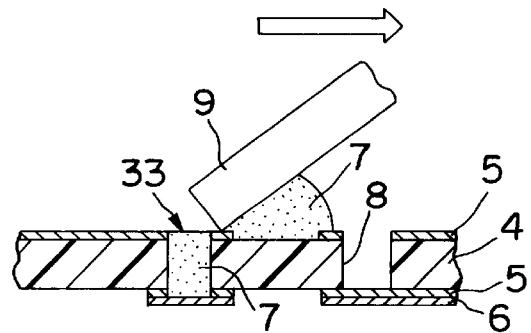
FIG. 2(a)–2(d) is a diagram showing mounting steps sequentially in embodiment 1 of the invention.

First, the external electrode terminal 6 of the circuit board 4 and the electrode 2 of the semiconductor element 1 are connected. The hole 8 is formed in a position of the circuit board 4, and the conductive paste 7 is printed in to fill up the hole 8 of the circuit board 4 by moving a squeegee 9 as shown in FIG. 2(a), and thus an external electrode terminal 33 of the circuit board 4 is formed.

Figure 2B:
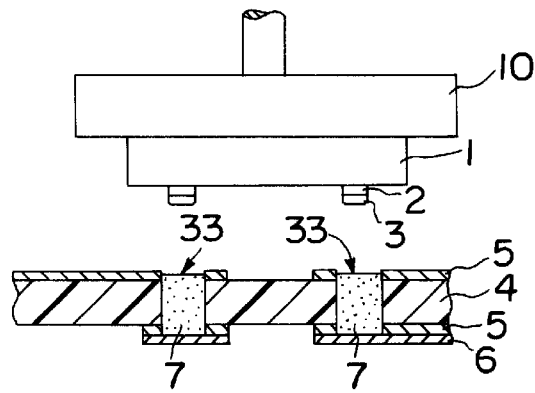

Next, as shown in FIG. 2(b), the semiconductor element 1 is attracted to a suction nozzle 10, and the protruding bump 3, and the external electrode terminal 33 of the circuit board 4 formed by the conductive paste 7 filling up the hole 8 are positioned.

Figure 2C:
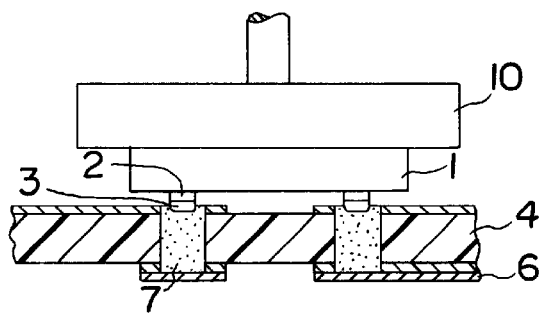
Figure 2D:
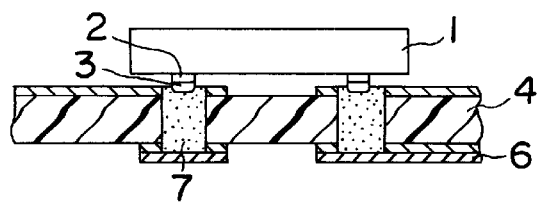

Then, as shown in FIG. 2(c), pressing the semiconductor element 1 by the suction nozzle 10, the protruding bump 3 is buried into the conductive paste 7 filling up the hole 8 of the circuit board 4 as shown in FIG. 2(d).

As a result, the protruding bump 3 of the semiconductor element 1 contacts with the conductive paste 7 in the hole of the circuit board 4, and they are electrically connected.

Figure 3:
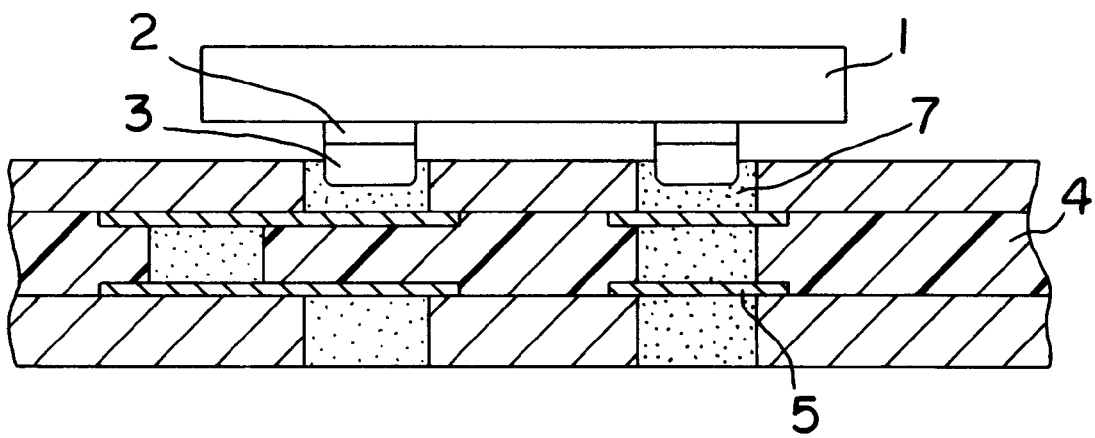
FIG. 3 is a junction sectional view of a semiconductor element and a circuit board after mounting in embodiment 1 of the invention.
Figure 4:
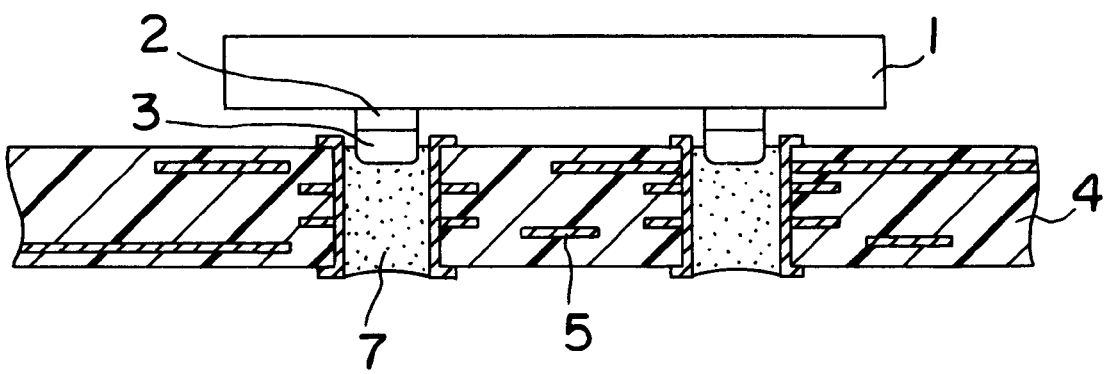
FIG. 4 is a junction sectional view of a semiconductor element and a circuit board after mounting in embodiment 1 of the invention.

Alternatively, the circuit board 4 may be also a multi-layer substrate conducting between layers in the substrate by inner via holes as shown in FIG. 3, or the circuit board 4 may be also a multi-layer substrate conducting between layers by through holes as shown in FIG. 4.

According to this embodiment 1, since the protruding bump 3 formed on the electrode 2 of the semiconductor element 1 is buried in the conductive paste 7 in the hole 8 of the circuit board 4, and contacts to be connected electrically, short circuit is not formed, and the tolerable range for warping and curving of the circuit board 4 is extended, and open state does not occur, so that the semiconductor element 1 and the circuit board 4 may be joined at high reliability.

(Embodiment 2)

FIG. 5 is a process diagram showing a forming method of a protruding bump on an electrode of a semiconductor element by employing a wire bonding method according to embodiment 2 of the invention, and the wire bonding method is described below while referring to FIG. 5.

Figure 5A:
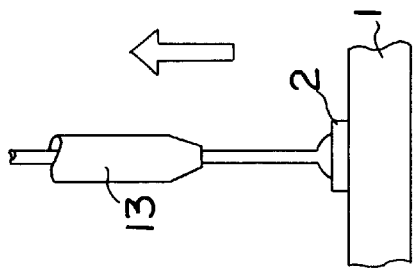
FIG. 5(a)–5(f) is a diagram showing steps of wire bonding method sequentially in embodiment 2 of the invention.

First, as shown in FIG. 5(a), a metal wire 11 made of gold, copper, aluminum, solder or the like is passed through a capillary 13 made of ceramic or ruby, and a metal ball 12 is formed by electric discharge between the end of the passed metal wire 11 and an electrode 14 called torch.

Figure 5B:
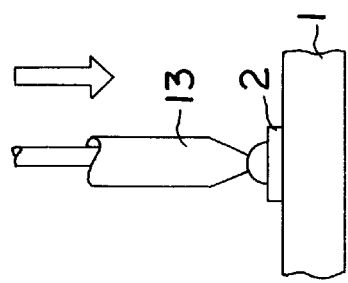

Next, as shown in FIG. 5(b), the metal ball 12 is pressed on an electrode 2 of a preheated semiconductor element 1, and ultrasonic vibrations are applied. Thus, by the action of temperature, pressure and ultrasonic vibrations, the metal ball 12 is joined to the electrode 2.

Figure 5C:
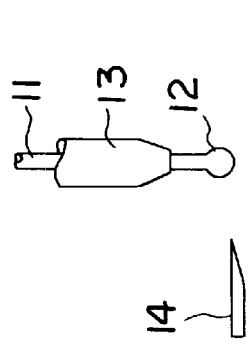
Figure 6:
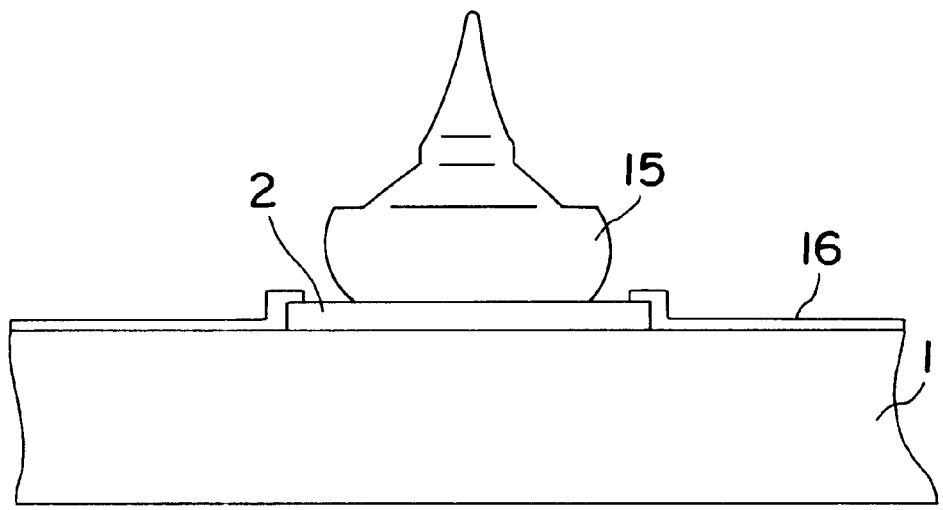
FIG. 6 is a side view of a protruding bump formed by the wire bonding method in embodiment 2 of the invention.

Then, as shown in FIG. 5(c), the capillary 13 is lifted in the perpendicular direction, and the metal wire 11 is torn off, and a bump 15 is formed by metal ball as shown in FIG. 6.

Figure 5D:
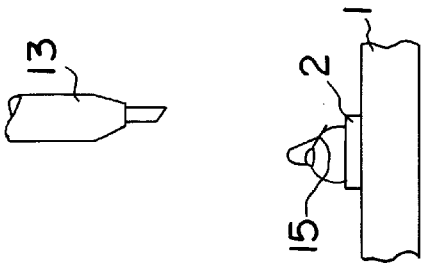

In succession, as shown in FIG. 5(d), after lifting the capillary 13, the capillary 13 is shifted sideways and lowered without tearing the metal wire 11, and the metal wire 11 is brought contact onto the metal ball 12, and by the action of temperature and pressure, or temperature, pressure and ultrasonic vibrations, the metal wire 11 is joined to the metal ball 12.

Figure 5E:
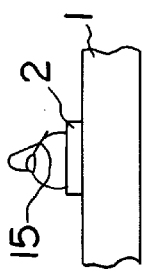
Figure 5F:
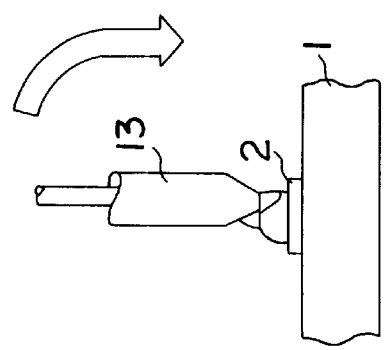
Figure 7:
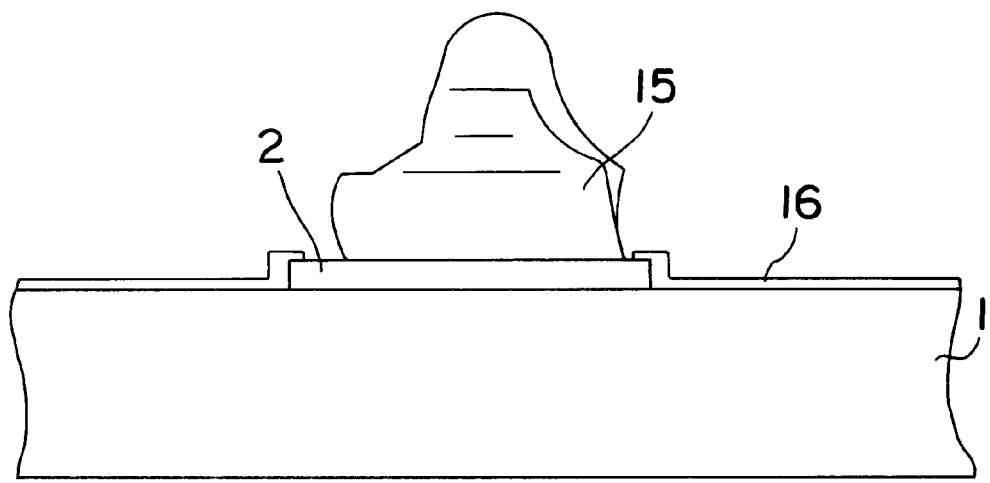
FIG. 7 is a side view of a two-stage protruding bump formed by the wiring bonding method in embodiment 2 of the invention.

Consequently, as shown in FIG. 5(e), the capillary 13 is lifted, the metal wire 11 is torn off, and a two-stage protruding bump 15 is formed by metal ball as shown in FIG. 5(f) and FIG. 7.

After forming the protruding bump 15 by metal ball on the electrode 2 of the semiconductor element 1 in this method, the semiconductor element 1 and the circuit board 4 are joined in the method shown in FIG. 8.

The mounting method in FIG. 8 is same as the method explained in embodiment 1, and its explanation is omitted.

Figure 8A:
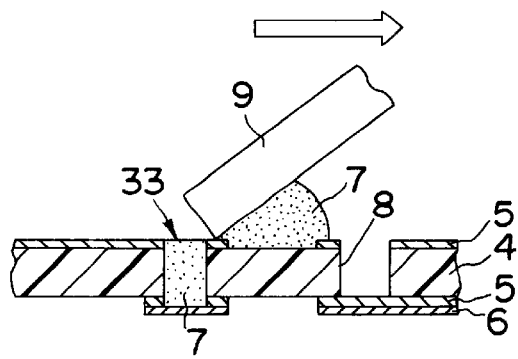
FIG. 8(a)–8(d) is a diagram showing mounting steps sequentially in embodiment 2 of the invention.
Figure 8B:
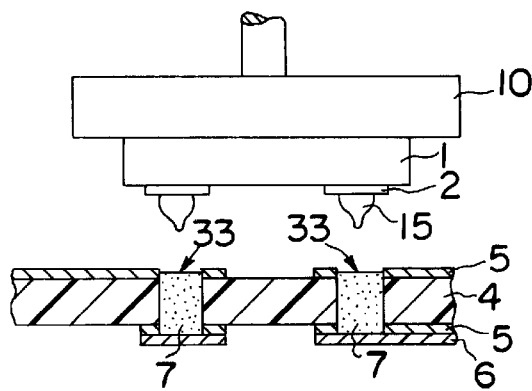
Figure 8C:
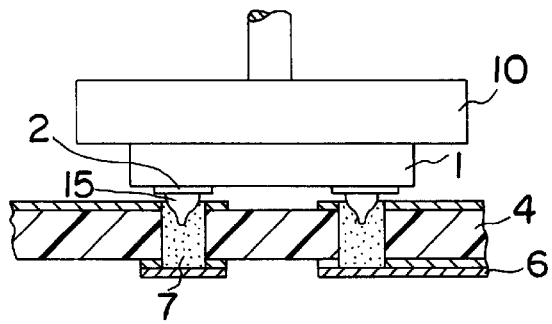
Figure 8D:
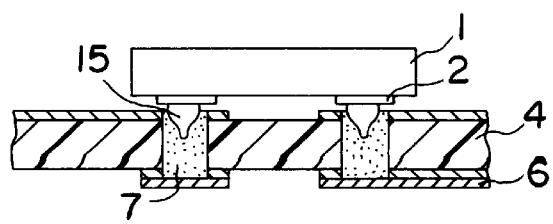

In this embodiment 2, in addition to the effects of embodiment 1, a high bump of 50 microns or more can be formed by the wire bonding method of the embodiment, as compared with the maximum height of about 25 microns of the protruding bump formed by the conventional electric plating method, and therefore, as shown in FIG. 8(c) and 8(d), the amount of the bump 15 buried in the conductive paste 7 in the hole 8 of the circuit board 4 is increased, and the tolerable range for warping and curving of the circuit board 4 is extended, so that mounting of higher reliability is realized.

(Embodiment 3)

A mounting method of semiconductor element in embodiment 3 of the invention is described below while referring to FIG. 9.

Figure 9:
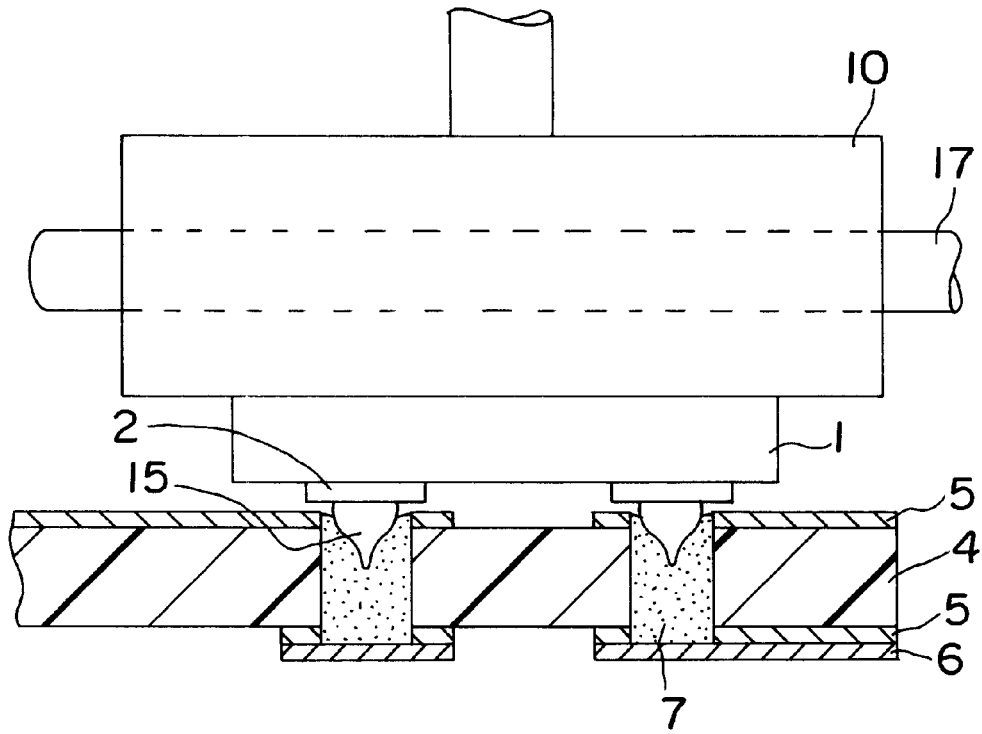
FIG. 9 is a diagram showing mounting steps sequentially in embodiment 3 of the invention.

In FIG. 9, a semiconductor element 1 is attracted to a suction nozzle 10, and is positioned to an external electrode terminal of a circuit board 4 forming a protruding bump 15 by conductive paste 7 filling up a hole 8, and they are pressed, and the protruding bump 15 is buried in the conductive paste 7. At this time, the suction nozzle 10 is heated by an incorporated heater 17, and the conductive paste 7 is cured simultaneously with pressing.

According to this embodiment 3, in addition to the effects of the foregoing embodiments 1 and 2, by curing the conductive paste 7, fixing of the semiconductor element 1 and circuit board 4 is stronger, and highly reliable junction is obtained. Moreover, conventionally, the conductive paste 7 was cured by batch treatment by putting the module in an oven, but it can be done in the same equipment simultaneously with joining in the method of the embodiment, and therefore the cycle time of production line of the semiconductor element 1 can be shortened.

(Embodiment 4)

A mounting method of semiconductor element in embodiment 4 of the invention is described below while referring to FIG. 10.

Figure 10:
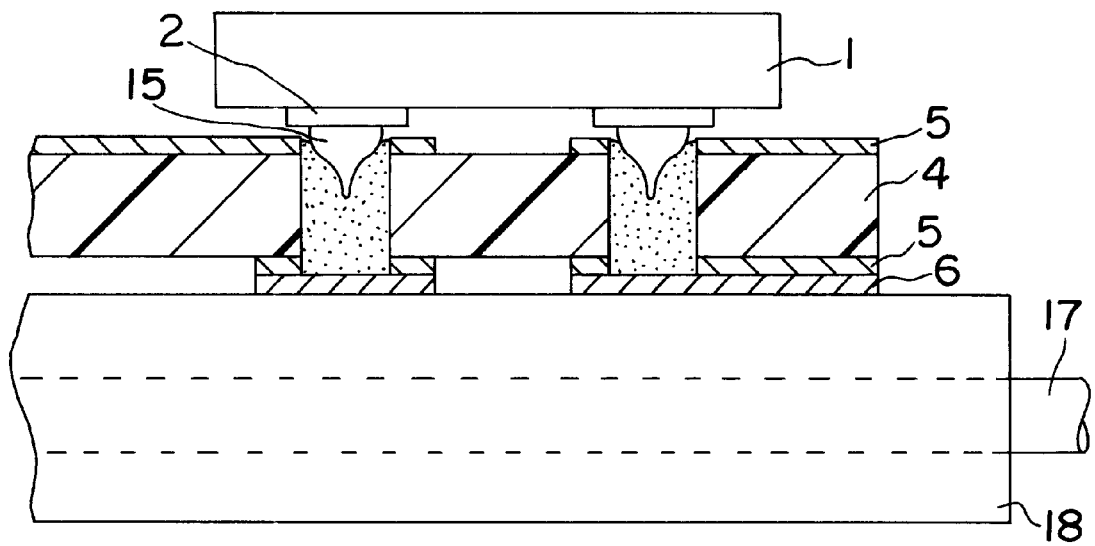
FIG. 10 is a diagram showing mounting steps sequentially in embodiment 4 of the invention.

In FIG. 10, a semiconductor element 1 is attracted to a suction nozzle 10, and is positioned to an external electrode terminal 33 of a circuit board 4 forming a protruding bump 15 by conductive paste 7 filling up a hole 8, and they are pressed, and the protruding bump 15 is buried in the conductive paste 7. At this time, a stage 18 holding the circuit board 4 is heated by an incorporated heater 17, and by heating when pressing the semiconductor element 1, the conductive paste 7 is cured with pressing.

According to this embodiment 4, in addition to the effects of the foregoing embodiments 1 and 2, by curing the conductive paste 7, fixing of the semiconductor element 1 and circuit board 4 is stronger, and highly reliable junction is obtained. Moreover, conventionally, the conductive paste 7 was cured by batch treatment by putting the module in an oven, but it can be done in the same equipment simultaneously with joining in the method of the embodiment, and therefore the cycle time of production line of the semiconductor element 1 can be shortened.

(Embodiment 5)

A mounting method of semiconductor element in embodiment 5 of the invention is described below while referring to FIG. 11.

Figure 11:
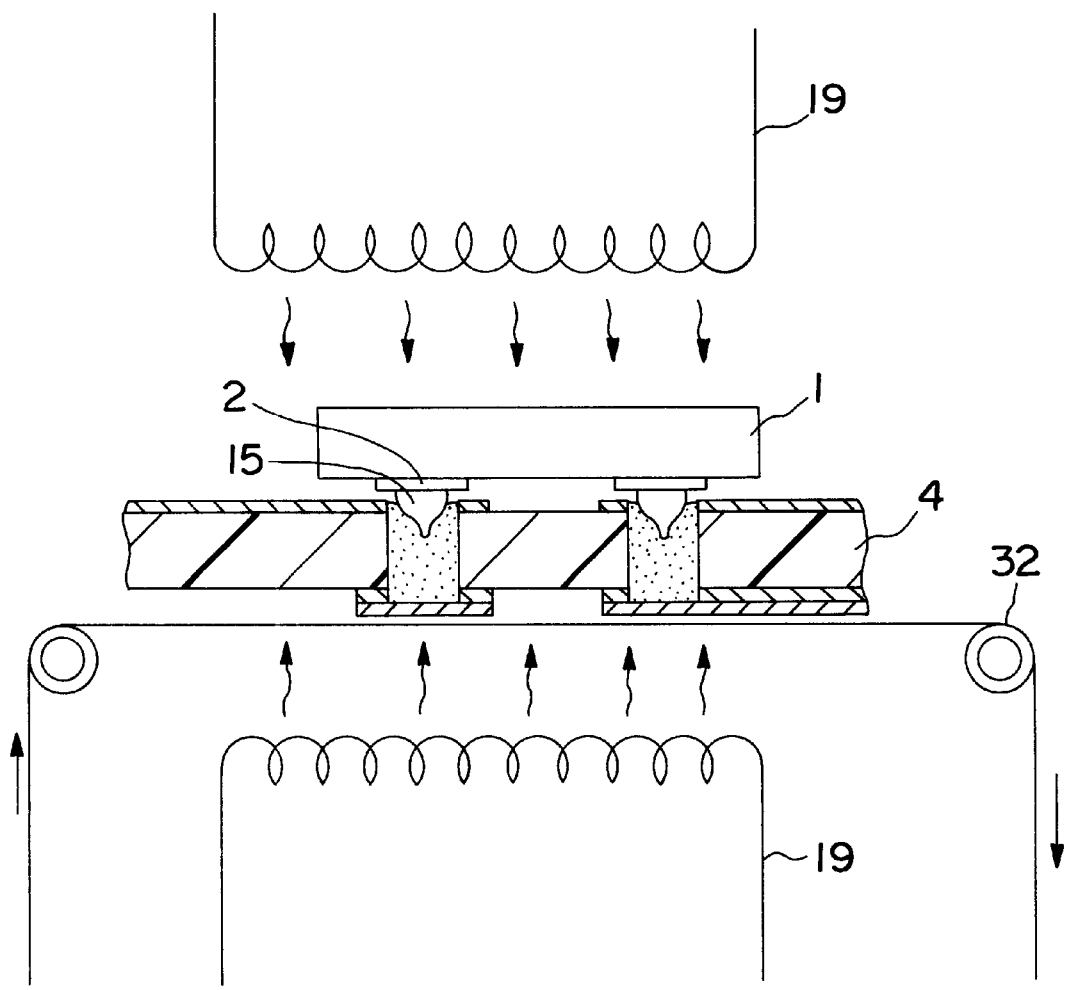
FIG. 11 is a diagram showing mounting steps sequentially in embodiment 5 of the invention.

In FIG. 11, in embodiment 5, a semiconductor element 1 is pressed, and a conductive paste 7 in a hole 8 of a circuit board 4 is brought into contact with a protruding bump 15 on an electrode 2 of the semiconductor element 1, a module (circuit board 4 and semiconductor element 1) is put on a conveyor 32, and the entire module is heated by a heater 19 while moving, so that the conductive paste 7 is cured.

According to this embodiment 5, in addition to the effects of the foregoing embodiments 1 and 2, by curing the conductive paste 7 in the reflow method by putting the entire module on the conveyor 32 and heating while moving, and hence it is possible to cure in the same production line as mounting. Therefore, without causing effect on the cycle of the production line of semiconductor element 1, fixing of semiconductor element 1 and circuit board 4 is made stronger, so that junction of higher reliability is realized.

(Embodiment 6)

A mounting method of semiconductor element in embodiment 6 of the invention is described below while referring to FIG. 12.

Figure 12:
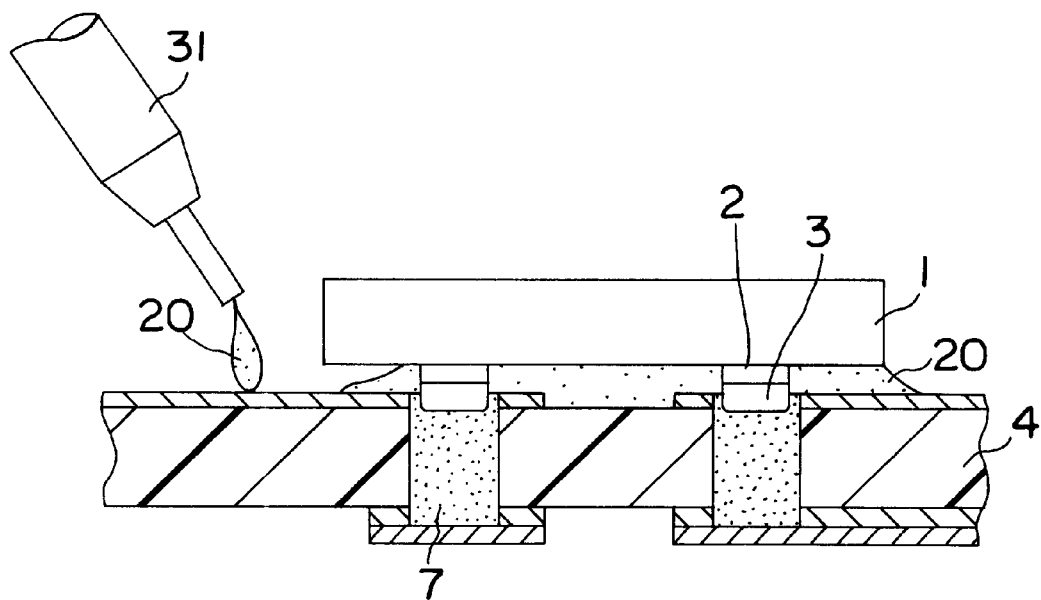
FIG. 12 is a diagram showing mounting steps sequentially in embodiment 6 of the invention.

As shown in FIG. 12, in the mounting process in embodiments 1 to 5, after mounting a semiconductor element 1 on a circuit board 4, the space between the semiconductor element 1 and circuit board 4 is filled with an epoxy resin 20 by using a syringe 31.

Figure 13:
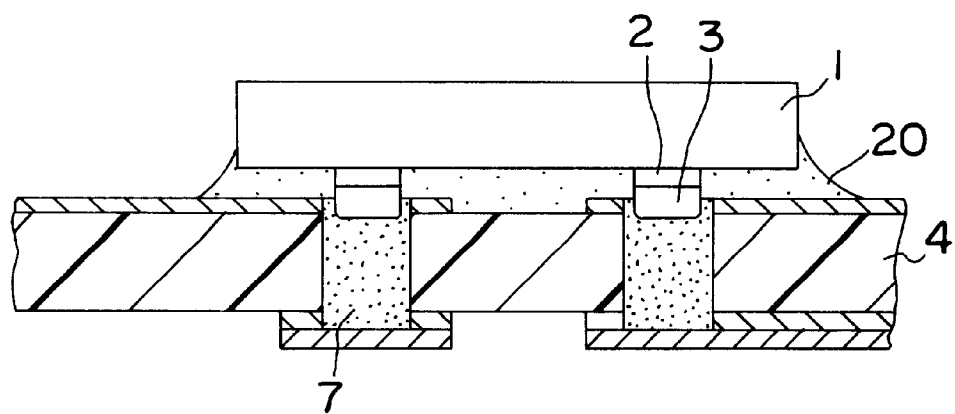
FIG. 13 is a junction sectional view of a semiconductor element and a circuit board after mounting in embodiment 6 of the invention.

According to this embodiment 6, in addition to the effects of the foregoing embodiments 1 through 5, as shown in FIG. 13, by filling with the epoxy resin 20, the active surface of the semiconductor element 1 and the surface of the electrode 2 are protected. Therefore, if the module is exposed, for example, to environments of high temperature and high humidity, corrosion of the electrode 2 and protruding bump 3 can be prevented, so that connection of high reliability is guaranteed.

(Embodiment 7)

A mounting method of semiconductor element in embodiment 7 of the invention is described below while referring to FIG. 14.

Figure 14A:
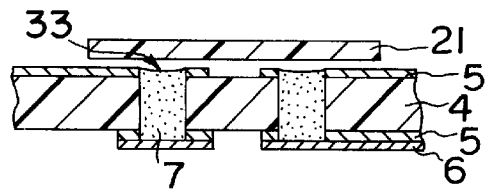
FIG. 14(a)–14(d) is a diagram showing mounting steps sequentially in embodiment 7 of the invention.

First, as shown in FIG. 14(a), a hole 8 in a circuit board 4 is filled with a conductive paste 7 to form an external electrode terminal 33, and an adhesive sheet 21 having a thermosetting resin, a thermoplastic resin, or a mixed thermosetting and thermoplastic resin is disposed on the circuit board 4.

It is also possible to disperse particles of nickel, solder, carbon, or gold plated plastic uniformly on the adhesive sheet 21.

Figure 14B:
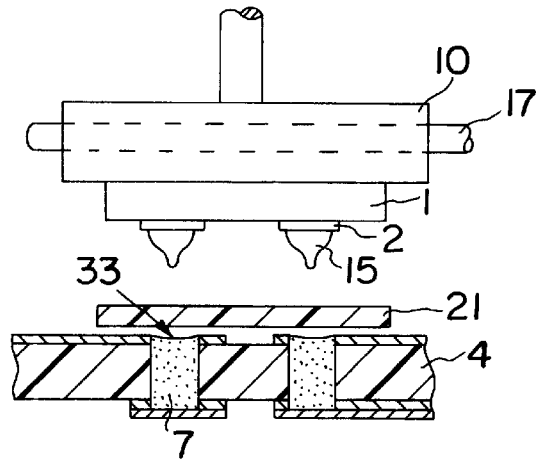

Next, as shown in FIG. 14(b), a semiconductor element 1 is attracted to a suction nozzle 10, and is positioned to an external electrode terminal 33 of the circuit board 4 forming a protruding bump 15 by the conductive paste 7 filling up the hole 8.

Figure 14C:
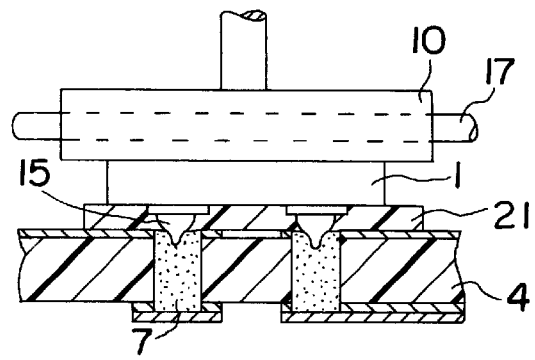

Then, as shown in FIG. 14(c), by pressing the semiconductor element 1, the adhesive sheet 21 is torn off by the protruding bump 15, and the protruding bump 15 is buried in the conductive paste 7. At this time, the suction nozzle 10 is heated by an incorporated heater 17, and the adhesive sheet 21 is melted and cured simultaneously with pressing.

Figure 14D:
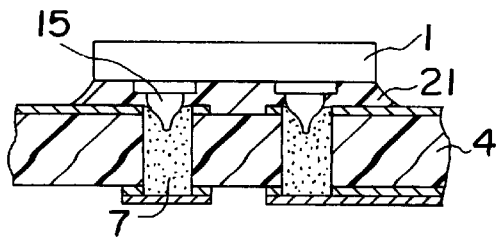

According to this embodiment 7, in addition to the effects of the foregoing embodiments 1 and 2, as shown in FIG. 14(d), the adhesive sheet 21 is melted and cured, and the active surface of the semiconductor element 1 and the surface of the electrode 2 are protected, so that the reliability of connection is further increased. Moreover, when using the adhesive sheet 21, the time required for pressing and curing is about 30 seconds, whereas the curing time of epoxy resin in the prior art is about 4 hours, and therefore the curing time in the embodiment is very short, and the cycle time of production line of semiconductor element 1 can be shortened.

(Embodiment 8)

A mounting method of semiconductor element in embodiment 8 of the invention is described below while referring to FIG. 15.

First, as shown in FIG. 15(a), after forming a protruding bump 15 on an electrode 2 of a semiconductor element 1, an adhesive sheet 21 having a thermosetting resin, a thermoplastic resin, or a mixed thermosetting and thermoplastic resin is disposed preliminarily on the protruding bump 15. It is also possible to disperse particles of nickel, solder, carbon, or gold plated plastic uniformly on the adhesive sheet 21.

Next, as shown in FIG. 15(b), the semiconductor element 1 is attracted to a suction nozzle 10, and is positioned to an external electrode terminal 33 of a circuit board 4 forming the protruding bump 15 by a conductive paste 7 filling up a hole 8, and by pressing, the adhesive sheet 21 is torn off by the protruding bump 15, and the protruding bump 15 is buried in the conductive paste 7. At this time, the suction nozzle 10 is heated by an incorporated heater 17, and the adhesive sheet 21 is melted and cured simultaneously with pressing.

According to this embodiment 8, in addition to the effects of the foregoing embodiments 1 and 2, same as in embodiment 7, the adhesive sheet 21 is melted and cured, and the active surface of the semiconductor element 1 and the surface of the electrode 2 are protected, so that the reliability of connection is further increased. Moreover, when using the adhesive sheet 21, the time required for pressing and curing is about 30 seconds, whereas the curing time of epoxy resin in the prior art is about 4 hours, and therefore the curing time in the embodiment is very short, and the cycle time of production line of semiconductor element 1 can be shortened.

Industrial Applicability

Therefore, according to the invention, by bringing the protruding bump formed on the electrode of the semiconductor element into contact with the conductive paste in the hole in the circuit board, and connecting the electrode of the semiconductor element and the external electrode terminal of the circuit board electrically, a short circuit between electrodes can be avoided, and the tolerable range for warping and curving of the circuit board is wide, so that an open state between the electrodes can be avoided, and mounting of high electrical reliability is realized.

Moreover, by preliminarily disposing the adhesive sheet on the circuit board or the protruding bump of the semiconductor element, tearing off the adhesive sheet at the time of mounting so that the protruding bump may contact with the conductive paste in the circuit board hole to connect electrically, and melting and curing the adhesive sheet, the active surface of the semiconductor element and the surface of the electrode can be protected by the adhesive sheet, and therefore the reliability of the connection is increased. Further, when using the adhesive sheet, the time required for pressing and curing is about 30 seconds, whereas the curing time of epoxy resin in the prior art is about 4 hours, and therefore the curing time in the embodiment is very short, and the time for the sealing process is notably saved, so that the cycle time of production line of semiconductor element can be shortened.

What is claimed is:

1. A mounting method of semiconductor element comprising:

a step of forming a hole in a position of a circuit board for connecting a circuit of said circuit board and an electrode of a semiconductor element, a step of filling said hole with a conductive paste for forming an external electrode terminal, step of forming a protruding bump on said electrode of said semiconductor element, said protruding bump having a generally conical shape and a tip, a step of disposing an adhesive sheet having a thermosetting resin, a thermoplastic resin, or a mixed thermosetting and thermoplastic resin, on said circuit board forming said external electrode terminal or said protruding bump of said semiconductor element, a step of positioning said external electrode terminal and said protruding bump formed on said electrode of said semiconductor element, a step of pressing said semiconductor element to break through said adhesive sheet by said tip of said protruding bump so as to contact between said conductive paste in said hole and said protruding bump, thereby electrically connecting said electrode of said semiconductor element and said external electrode terminal of said circuit board, and a step of heating said semiconductor element by a heating tool to melt and cure said adhesive sheet after the step of pressing.

* * * * *

UNITED STATES PATENT AND TRADEMARK OFFICE
CERTIFICATE OF CORRECTION

PATENT NO. : 6,051,093
DATED : April 18, 2000
INVENTOR(S) : Tsukahara

It is certified that error appears in the above-identified patent and that said Letters Patent is hereby corrected as shown below:

Title page,
Item [56], References Cited, FOREIGN PATENT DOCUMENTS, "4-267394  5/1992 Japan" should read -- 4-137641  5/1992  Japan --.

Column 10,
Line 27, before "step" insert -- a --.

Signed and Sealed this

First Day of January, 2002

Attest:

Attesting Officer

JAMES E. ROGAN
Director of the United States Patent and Trademark Office